Dec. 22, 1970 A. R. HARING 3,548,494

METHOD OF FORMING PLATED METALLIC PATTERNS
ON A SUBSTRATE

Filed Jan. 31, 1968 3 Sheets-Sheet 1

INVENTOR
A. R. HARING
BY R. P. Miller
ATTORNEY

Dec. 22, 1970 A. R. HARING 3,548,494

METHOD OF FORMING PLATED METALLIC PATTERNS ON A SUBSTRATE

Filed Jan. 31, 1968 3 Sheets-Sheet 2

Dec. 22, 1970 A. R. HARING 3,548,494

METHOD OF FORMING PLATED METALLIC PATTERNS ON A SUBSTRATE

Filed Jan. 31, 1968 3 Sheets-Sheet 3

United States Patent Office 3,548,494

Patented Dec. 22, 1970

3,548,494

METHOD OF FORMING PLATED METALLIC PATTERNS ON A SUBSTRATE

Allen R. Haring, Kutztown, Pa., assignor to Western Electric Company, Incorporated, Broadway, N.Y., a corporation of New York Filed Jan. 31, 1968, Ser. No. 71,897
Int. Cl. H05k 3/30
U.S. Cl. 29—626 6 Claims

ABSTRACT OF THE DISCLOSURE

A method of uniformly plating a plurality of separate contact areas supported on a ceramic header, each of which surrounds a pin which protrudes through the ceramic header, by electrically connecting the areas to each other with a strip of fusible material, intermediate portions of which have reduced cross sections. Following plating, electrical energy is applied between pins to melt the reduced intermediate portion therebetween and destroy the electrical connection between the areas.

BACKGROUND OF THE INVENTION

(1) Field of the invention

This invention relates to a method of forming plated metallic patterns on a substrate, and more particularly, to a method of plating uniformly a plurality of discrete areas supported on a substrate by interconnecting the discretion areas before plating and then disconnecting the discrete areas following the plating operation.

(2) Description of the prior art

In the manufacture of multichip integrated circuits, a plurality of metallized areas are applied by a silk screen process to a ceramic substrate. These metallic areas contact pins or terminals which protrude through the substrate and which are brazed to the metallized areas. The pins or terminals provide the external connections for the multichip integrated circuit while the metallized areas provide internal surfaces for mounting the chips. It is important that the plating of the metallized areas be uniform so that subsequent strength-type tests may be made on brazed joints which have uniform properties. If the plating is not uniform, then one or some of the leads may fail under the tests and thereby render the header unacceptable and unusable.

Initially, a silk screen process is used to place a pattern of a mixture of molybdenum and manganese metal powders, in paste form, hereinafter referred to as "moly manganese" on the ceramic substrate. The moly manganese is dried, and then sintered to form part of the crystal of the substrate at the interface of the substrate and the moly manganese.

Then a predetermined lot of ceramic substrates is placed in a commercially available barrel plating apparatus, in which, for example, stainless steel shot may be tumbled within a rotating barrel partially immersed in a plating solution to contact the areas to be plated. As the barrel is rotated and the shot and substrates are tumbled, the plating process proceeds as the shot contacts the previously sintered areas and completes an electrical circuit from an external source of current through the barrel and the shot and plating solution to the sintered areas and then back out through anodic rods to the current source. However, it remains to chance as to how many times each of the areas is contacted. Needless to say, this reduces the possibility of a uniform plating and could lead to meaningless and wasted tests when one or only a few of the leads fail under the push test.

In order to obtain uniform plating of the areas surrounding the pins, the areas must be electrically connected to each other so that when the shot makes contact with any portion of the interconnected pattern of discrete pin areas, an electrical circuit is completed from the barrel through the shot and pattern. To accomplish this, at the time the discrete areas are formed, a metallic ribbon or annular strip is formed concentrically with the periphery of the substrate, and is connected by individual and generally radially disposed runners to each pin.

One of the problems is to disconnect the pin areas from each other after plating the interconnected pattern of strip and discrete areas in order to electrically isolate the pins or terminals on the final header assembly. Presently, this is done by sand blasting a gap in the ribbon or strip between adjacent pins. This process is time consuming and, as an unclean operation, it counteracts the otherwise controlled conditions under which integrated circuits are manufactured. Moreover, care must be exercised so as not to damage the plated areas around each pin. As can well be imagined, such care, when considered along with the minuteness of the product here involved, works great demands on the operative force and equipment and, hence, involves excessive expenditures. In view of the nature of the product and the costs expended, it is an object of this invention to eschew the cumbersome processes currently used and to remove predetermined portions of a metal pattern on a substrate in order to successfully complete the uniform plating of a plurality of discrete areas on the substrate.

Also, prior to the use of a connecting strip of electrically conductive material, it was necessary to apply what is commonly referred to as a copper strike which is a fast copper plate under a high current density. This was found to present a good conducting path for the plating metal, for example, nickel. However, there was a drawback in that it was difficult to control the ratio of copper to nickel, this ratio being an important factor in the brazing operation. By eliminating the copper, it was found that a better brazed joint between the pins and the metal plating was obtained. The use of the metal ribbon or annular strip to uniformly plate has obviated the need for a copper strike.

It is an object of this invention to utilize an electrically conductive ring or strip of material about the discrete areas on the substrate and interconnected with the discrete areas in such a manner as to overcome previously encountered difficulties and inefficiencies in the prior art methods of disconnecting the areas after the plating operation.

Moreover, it is an object of this invention to utilize a fusible strip of material having bridges to interconnect individual island areas of an article of manufacture with necked-down portions between adjacent areas to facilitate subsequent disconnection upon application of a predetermined current.

SUMMARY OF THE INVENTION

With these and other objects in mind, the present invention contemplates a method of forming plated metallic patterns on a supporting surface which are interconnected with a strip or section of electrically conductive and fusible material and, then, following the plating process, the plated metallic patterns are isolated by applying heating energy sufficient to melt the interconnecting sections.

More particularly, this invention relates to a method of uniformly plating a plurality of discrete areas on a substrate which are encircled by and individually joined to a circumscribing ring of fusible material with the ring having necked-down or reduced cross-sectional size portions between adjacent areas. The discrete areas and circumscribing ring are then plated uniformly in a commercially available plating apparatus. Then a predetermined electrical current is applied across the necked-down portion between adjacent metallized areas which is of sufficient intensity to melt the necked-down portion of the fusible material and thereupon isolate electrically the adjacent areas.

Other objects and advantages of the present invention will be apparent from the following detailed description, when considered in conjunction with the accompanying drawings.

BRIEF DESCRIPTION OF THE DRAWINGS

Referring now to FIG. 1, there is shown a completed header, designated generally by the numeral 10, having a plurality of pins or terminals, designated generally by the numerals 11, which extend through an insulative, for example, ceramic, substrate 12. Each of the pins or terminals 11 has an elongated portion 13 with a head 14 welded thereto (see FIG. 4). The ceramic substrate is formed with a plurality of apertures 15 (see FIG. 2). The completed ceramic substrate is plated with gold and supports a plurality of integrated circuit chips (not shown).

Figure 1:
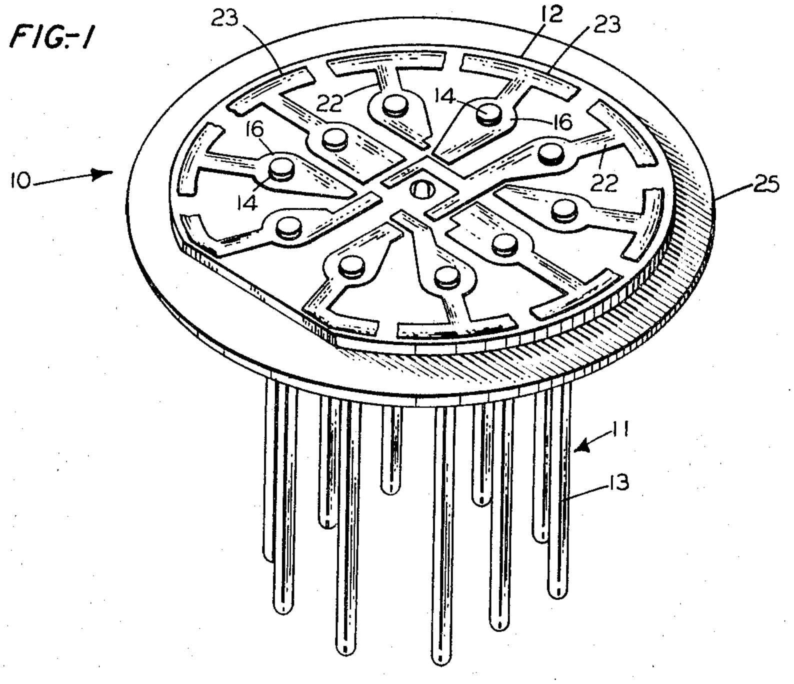
FIG. 1 is a perspective view of a completed header subassembly in which a plurality of discrete metallized areas have been plated uniformly and then electrically separated from each other by employing the steps of a method which embodies the principles of the present invention.
Figure 2:
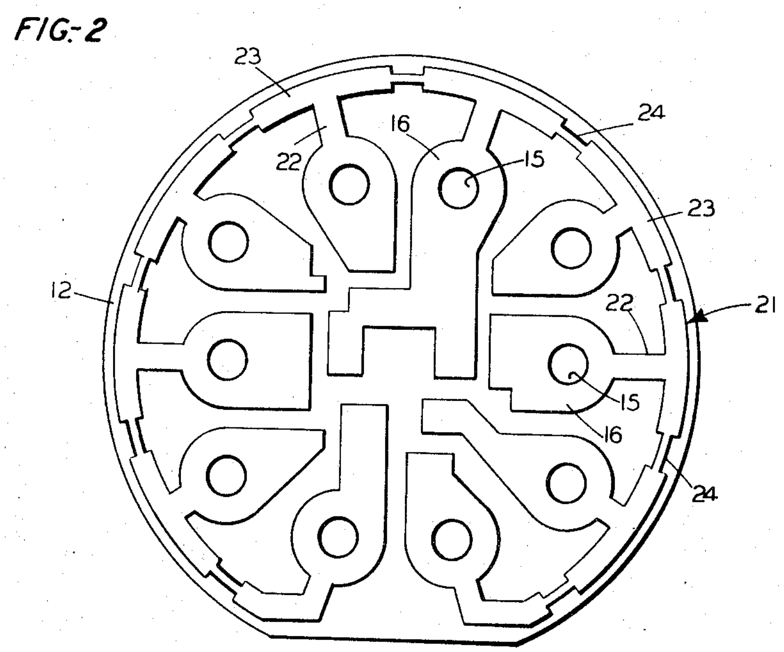
FIG. 2 is a plan view of a header subassembly showing a metallized pattern on a substrate with a plurality of discrete areas joined individually by generally radial runners to a peripheral ring of electrically conductive fusible material having necked-down portions between adjacent areas.

As can best be seen in FIG. 2, a top surface of the ceramic substrate 12 has a plurality of discrete areas 16, each of which surrounds on of the pins 11. The discrete areas 16 are formed initially from a metallized pattern, designated generally by the numerals 17 (see FIG. 4), and are positioned for the subsequent reception of the integrated circuit chips. The metallized pattern 17 is composed of a moly manganese metal which is deposited on the ceramic header by a silk screen process. The moly manganese which is applied by the silk screen process is in paste form and is allowed to air dry.

In this particular embodiment, after the silk screen process is used to apply the pattern 17 of moly manganese thereon, the substrates are placed into a heating chamber and sintered at a temperature of between 1500–1550° centigrade. The moly manganese sinters into the ceramic substrate 12 and becomes part of the ceramic crystalline structure at the interface of the metallized pattern and the ceramic substrate.

In order to attach the pins 11 to the header assembly 10, each of the pins is brazed to one of the discrete areas 16 on the substrate 12. However, the pins 11 cannot be brazed to the moly manganese pattern 17 which has been deposited on the substrate 12 by the silk screen process. Therefore, a layer 18 of nickel is plated on the moly manganese pattern on which a gold layer 19 is subsequently deposited. It is most desirous to obtain a plurality of uniformly plated discrete areas or contact areas 16 so that when the pins 11 are brazed thereto the joints will be uniform and meaningful and acceptable strength-type tests may be conducted on all of the joints.

The discrete areas 16 may be uniformly plated with the nickel by interconnecting all of the discrete areas and then using a barrel plating process. The interconnecting of the discrete areas 16 may be accomplished in any number of different patterns. As soon as any one area is contacted, for example, by stainless steel shot which is tumbled in a rotating barrel partially immersed in a plating solution, a circuit is completed from a source of current through the barrel, solution, shot and pattern to plate uniformly over all the areas.

An interconnecting section between the areas 16 is generally made by a peripheral ring, designated generally by the numberal 21, formed on the top of the ceramic substrate 12 with the initial pattern 17 of moly manganese in the silk screen process (see FIG. 2). As will be noticed in FIG. 2, each of the areas 16 is connected to the peripheral ring 21 by a generally radically disposed runner 22.

However, the problem arises in that after the barrel plating process has been completed, and after the pins 11 have been joined thereto, the pins must be electrically insulated from each other. It is apparent that the discrete areas 16 comprising a nickel-plated pattern of moly manganese must therefore be disconnected from each other. In order to accomplish this, advantage is taken of the fusible characteristics of the plated moly manganese ring 21 in forming the ring.

The peripheral ring 21 is formed on the ceramic substrate 12 with a nonuniform cross section. Referring to FIG. 2, it is seen that an arcuate portion 23 of the ring 21 on each side of each of the radial runners 22 has approximately the same cross-sectional shape as the runners. The arcuate portions 23 of the ring 21 are generally centered on each of the runners 22 (see FIGS. 2 and 3).

Each pair of adjacent main arcuate portions 23 are joined together by a narrower or necked-down intermediate portion 24 (see FIG. 2), which is dimensioned in the silk screen process so as to have a predetermined current-carrying capacity. On the other hand, the main portion 23 and the radial runners 22 are dimensioned to have a current-carrying capacity greater than that of the narrower intermediate portions 24. Since resistance is proportional to the product of resistivity and length and the reciprocal of cross-sectional area of the conductor, the resistance of any portion of the pattern relative to any other portion thereof depends on the area. Because the plating thickness in the particular header 10 described herein is substantially uniform over the entire pattern on the ceramic substrate, it will be convenient hereinafter to refer to cross-sectional areas in terms of width only. As the width of any portion of the pattern 17 is reduced, the area is reduced and the resistance of that portion of the pattern is increased. The amount of heat energy required to melt or burn out the fusible material decreases as the resistance increases. The greater the resistance, the less the current-carrying capacity of any portion of the strip will be before burn-out occurs.

Morover, the narrower intermediate portions 24 are dimensioned so that no burn-out will occur during the plating process. It follows that since the main portions 23 are wider than the narrower intermediate portion 24, there will be no burn-out of the main portions when a predetermined current greater than the current-carrying capacity of the portion 24 is passed through the pattern.

After the ceramic substrate 12 has been placed in the barrel plating apparatus (not shown) and the pattern plated with a layer 18 of nickel (see FIG. 4), an annular brazing preform (not shown) formed from a compound comprised of, for example, 28% copper and 72% silver, is placed over the elongated portion 13 of a pin 11. Then, the pin, designated generally by the numerals 11, is inserted through each of the apertures 15 in the ceramic substrate until the head 14 of the pins abuts the brazing preform, which in turn abuts the nickel-plated layer 18 on the discrete area 16 surrounding each of the holes in the substrate, and is then brazed to the nickel plate.

At the time the pin 11 is inserted into one of the apertures 15, the elongated portion 13 is only tack-welded to the head 14 and, hence, is only temporarily secured thereto. When the pin 11 is brazed to the nickel-plated layer 18 on the substrate 12, some of the brazing material also runs up under the head 14 of the pin 11 to permanently secure the head 14 to the elongated portion 13. Simultaneously with the brazing of the heads 14 of the leads 11 to the nickel-plated discrete areas 16, the plated ceramic substrate subassembly 10 is brazed to a platform 25 (see FIG. 4).

Next, the header 10 is subjected to several tests. For example, the header 10 is tested for strength characteristics of the brazed bond of the pin 11 to the layer 18 of nickel plate on each of the discrete areas 16. This is done by pushing against the free end of each of the pins 11 to attempt to break the brazed bond between the head 14 and the nickel-plated discrete areas 16.

Also, a resonant frequency test, commonly referred to as a "ping" test is performed at this time. The header 10 is clamped in a test fixture (not shown) and each of the pins is plucked. The resonant frequency of each oscillatory cycle, which is thereupon induced, is tested and must be greater than a standard frequency. If the measured resonant frequency is less than the standard, there may be insufficient brazing material between the head 14 and the elongated portion 13 which weakens the joint therebetween.

Lastly, the header 10 is subjected to a fluid pressure differential across the two sides of substrate 12 and is tested to determine if the brazed joints between the leads 11 and the discrete areas 16 are sealed to prevent leakage. Finally, the header is gold plated and the assembled unit is generally referred to as a brazed header (see FIG. 4).

Before the integrated circuit chips are placed on the discrete areas 16 of the ceramic substrate 12, the areas must be electrically disconnected from each other. This is accomplished, in accordance with the principles of the method of this invention, by applying a predetermined current between each adjacent pair of pins 11. The predetermined current is selected to exceed the current-carrying capacity of the narrow intermediate portions 24 and which is less than the current-carrying capacity of the main portions 23.

In this way, as the narrow or necked-down intermediate portions 24 are bridged, electrical current flows through the main portions 23 and the necked-down intermediate portions and burns off or melts the intermediate fusible portions of the peripheral ring 21. Since the radial runners 22 are substantially of the same general width as the main portion 23 of the peripheral ring 21, the radial runners are unaffected.

Figure 4:
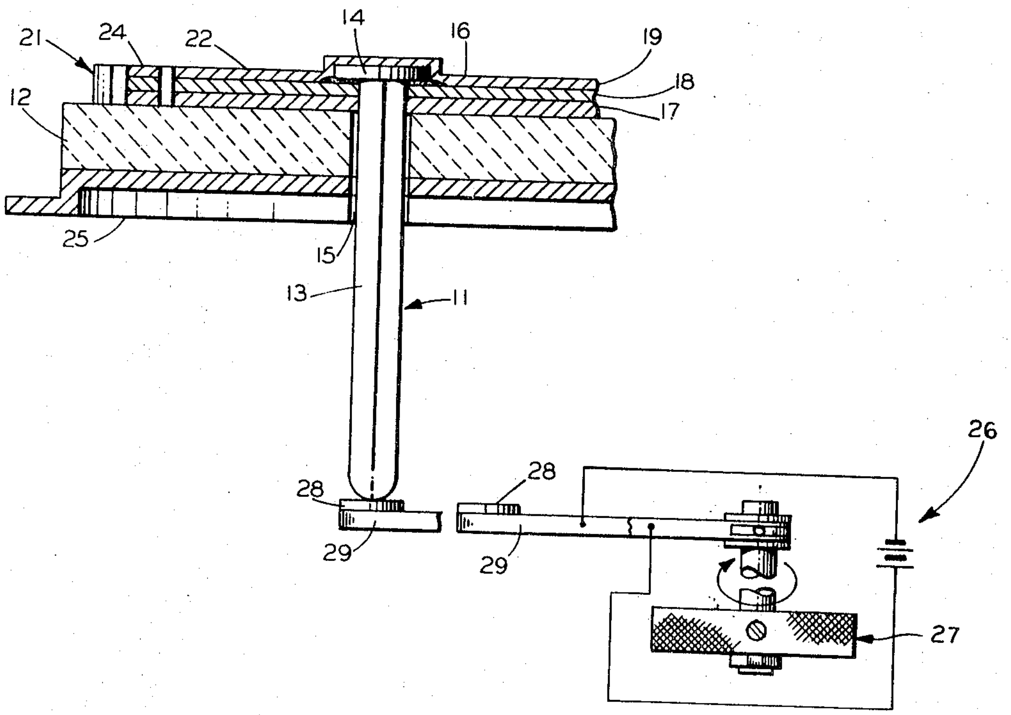
FIG. 4 is a detail view partially in section and showing a portion of the completed header subassembly with a pin or terminal placed through an aperture in one of the discrete areas and with a gold plating applied over the subassembly.

The melting or burning off of the necked-down or intermediate portions is accomplished by using a source of current 26 and a rotary switch, designated generally by the numerals 27, for example (see FIG. 4). A specially adaptable test socket (not shown) is connected to the rotary switch 27 and the assembled header 10 is plugged into the test socket. The test socket is selected to have as many openings as there are pins 11 on the header 10. Moreover, the openings in the socket must have the same orientation as that of the pins 11 on the substrate. As the rotary switch 27 is turned, each pair of adjacent pins 11 is connected in seriatim through contacts 28 mounted on a pair of wiper arms 29 and the switch to the external source of current. As stated hereinbefore, the current is selected to be greater than the current-carrying capacity of the narrow intermediate portions 24.

Figure 3:
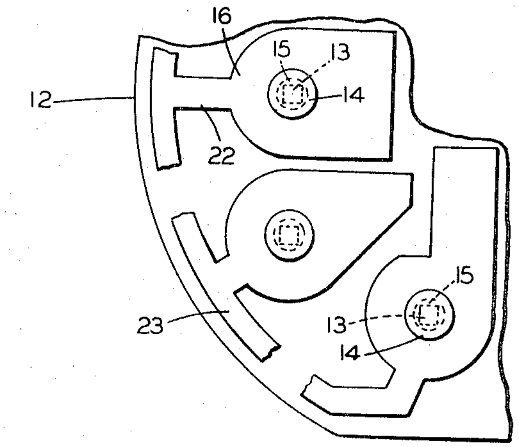
FIG. 3 is a detail view in plan of a portion of the header subassembly and showing a portion of the peripheral ring of electrically conductive and fusible material after a predetermined current has been passed therethrough to melt the necked-down portions.

After the process of burn-off has been completed, the gold-plated moly manganese pattern 17 on the ceramic substrate 12 of the header 10 is generally, as shown in a portion thereof in FIG. 3, with the necked-down portions 24 removed and leaving the areas 16 and the main portions 23 of the peripheral ring 21, which are associated with each of the pins 11, essentially insulated electrically from each other. The header assembly 10 is now completed and is ready to raceive integrated circuit chips in the final assembly process.

Figure 5:
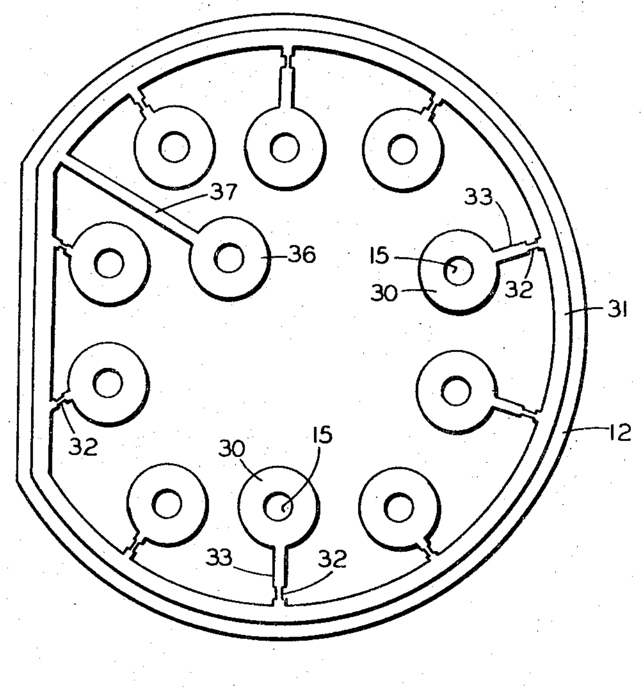
FIG. 5 is a plan view of another type of header subassembly with the necked-down portions formed in the generally radial runners and which may be plated uniformly in accordance with the principles of the method of the present invention.
Figure 6:
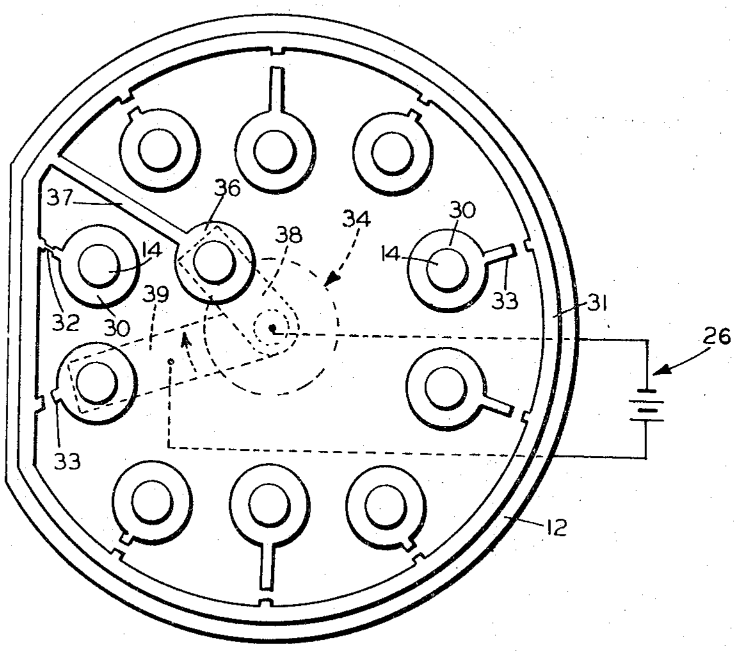
FIG. 6 is a plan view of the header subassembly shown in FIG. 5 and portraying the header subassembly after a predetermined current has been passed through the peripheral ring and successively through each of the pins in each of the discrete areas to melt the fusible necked-down portions in the radial runners.

In an alternative header assembly, it is necessary that a plurality of discrete areas 30 be isolated from a grounding ring 31 (see FIG. 5). Therefore, narrowed or necked-down fusible portions cannot be provided in the grounding ring 31. Instead, a necked-down portion 32 is formed in each of a plurality of runners 33 so that after the barrel plating process for applying the nickel is completed, the current is applied as before through a slightly modified rotary switch 34 (see FIG. 6), and successively between each of the pins 11 and the grounding ring 31. In the alternative header assembly shown in FIG. 5, an enlarged area 36 is formed in the moly manganese pattern similar to the discrete areas 30. However, the area 36 is joined to the grounding ring 31 by a radial runner 37 which is of uniform cross-sectional area. The rotary switch 34 is constructed to have one wiper arm 38 constantly in contact with the area 36 and a movable wiper arm 39 which is rotated to contact in succession each of the discrete areas 30.

Since the predetermined current is greater than the current-carrying capacity of the necked-down portion 32 in each of the radial runners 33, each of the radial runners is electrically severed at the necked-down portion thereof and each of the areas 30 is thereupon electrically insulated from the grounding ring 31. Moreover, the grounding ring 31 remains intact for use in the final circuit.

In this alternative header assembly, the metallized substrate 12 is not brazed to a platform 25 as before.

Applying the principles of the method of this invention to this alternative header assembly, the original pattern of moly manganese is plated with nickel. Then the top portion of the header subassembly 10 is coated evaporatively with titanium and then gold. It has been found that the titanium and gold coating process may be adversely affected if the nickel plating is not uniform.

Then the header is treated in an etching solution to etch away the titanium and gold over the nickel-plated moly manganese except on the discrete areas 30 where the gold will suffice to bond thermocompressively the pin 11 to the discrete area. The pins 11 and the heads 14 are gold plated separate and apart from the gold plating of the header. Then a head 14 of a pin 11 is bonded by a commercially available thermocompression bonding apparatus to the deposit of gold on each of the discrete areas 30.

Next, the necked-down portions 32 are melted as described hereinbefore and the pins 11 of the completed alternative header assembly are subjected to a push-type strength test.

It is to be understood that the above-identified embodiments are simply illustrative of the principles of the invention and numerous other modifications may be devised without departing from the spirit and scope of the invention.

What is claimed is:

1. A method of forming plated metallized patterns which are supported on an electrically non-conductive substrate having an initial pattern of metallized discrete areas interconnected by metallized sections, said metallized sections having a predetermined current-carrying capacity above which the metallized sections melt, including the steps of:
   immersing said substrate in a metal plating bath;
   applying electrical energy of a magnitude below said predetermined current through said patterns by contacting any one point on the said initial pattern to electroplate said initial pattern;
   removing said substrate from said bath; and then
   applying electrical energy through said interconnecting sections of a magnitude sufficiently above said predetermined current to melt said interconnecting sections and isolate said plated metallized discrete areas.

2. A method of plating uniformly in a metal plating bath, a metallized pattern of a plurality of discrete areas on an electrically non-conductive substrate which are interconnected by a strip of fusible material having necked-down portions of predetermined current-carrying capacity between adjacent areas, including the steps of:
   immersing said substrate in said bath;
   randomly contacting electrically any one point of said pattern to complete an electrical circuit therethrough;
   applying electrical energy below said predetermined current through said electrical circuit to plate metal from said bath onto said pattern;
   removing from said bath; and
   passing successively an electrical current, greater than said predetermined electrical current, through each adjacent pair of discrete areas to melt said fusible necked-down portions.

3. A method of forming plated metallic patterns on an electrically non-conductive substrate, which comprises:
   forming a pair of separated metallized patterns on a substrate, the initial pattern having metallized discrete areas with an interconnecting metallized section having a cross-sectional area which is less than the cross-sectional area of said metallized discrete areas, said metallized section having a predetermined current-carrying capacity above which the metallized section melts;
   immersing said metallized substrate in an electroplating bath;
   applying electrical energy to any one point on said initial pattern of magnitude below said predetermined current through said metallized discrete areas and said interconnecting metallized section to electroplate said initial pattern;
   removing from said bath; and then
   applying electrical energy through said interconnecting metallized section of a magnitude sufficiently above said predetermined current to melt said interconnection and isolate said plated metallic metallized discrete areas.

4. A method of plating uniformly a plurality of discrete areas supported on an electrically non-conductive substrate including the steps of:
   coating said substrate with a fusible base metal in a pattern having discrete areas interconnected with necked-down portions which have a predetermined current-carrying capacity that is less than the current-carrying capacity of the discrete areas;
   immersing said substrate in a bath of metal plating solution;
   randomly contacting electrically any one random portion of said base metal to complete an electrical circuit through said solution and said pattern;

applying electrical energy through said electrical circuit to plate metal from the bath to said pattern;
   removing said substrate from said bath; and
   increasing the electrical energy through said electrical circuit to burn out said fusible necked-down portions to separate said discrete areas.

5. A method of plating uniformly a plurality of discrete areas each of which surrounds a pin protruding from a ceramic substrate comprising the steps of:
   masking said substrate to expose a pattern comprising a ring encircling said discrete areas with interconnections between each of said discrete areas and said ring, said ring between adjacent discrete areas having a reduced cross section intermediate thereof;
   coating the pattern on said masked substrate with a metallic paste-like fusible material;
   sintering said substrate to dry said metallic material;
   immersing said substrate in a metal plating bath;
   randomly contacting electrically any one point on said pattern to complete an electrical circuit therethrough;
   applying electrical energy through said electrical circuit to plate metal from the bath to said pattern;
   removing said substrate from said bath;
   securing a pin to each of said discrete areas; and
   applying an electrical current successively between adjacent pins to melt said intermediate reduced cross section portions.

6. A method of plating uniformly a plurality of discrete areas mounted on an electrically non-conductive comprising the steps of:
   metallizing said substrate with a fusible and electrically conductive material to form a pattern which comprises said discrete areas, a peripheral strip which circumscribes said discrete areas, and individual connections between each of said discrete areas and said strip, each of said connections having a necked-down portion between said discrete areas and said strip, said necked-down portions having a predetermined current-carrying capacity;
   immersing said substrate in a metal plating solution;
   randomly contacting any one point of said pattern to complete an electrical circuit through said pattern and said plating solution;
   applying electrical energy below said predetermined current through said electrical circuit to plate metal from said solution onto said pattern;
   removing said substrate from said bath; and
   passing a current greater than said predetermined current between each of said discrete areas in seriatim and said peripheral strip to burn out said necked-down portions and separate said discrete areas from said strip.

References Cited

UNITED STATES PATENTS

| | | | |
|---|---|---|---|
| 3,309,761 | 3/1967 | Deakin | 113—119X |
| 893,811 | 7/1908 | Pickard | 29—25.42X |
| 2,070,435 | 2/1937 | Katzman | 29—25.42X |
| 2,399,753 | 2/1941 | McLarn | 29—626UX |
| 2,171,127 | 8/1939 | Kohman | 29—25.42 |
| 2,651,100 | 8/1953 | Grouse | 29—25.42 |
| 3,402,448 | 8/1968 | Heath | 29—25.42 |

FOREIGN PATENTS

| | | | |
|---|---|---|---|
| 867,560 | 5/1961 | Great Britain | 204—201 |

JOHN F. CAMPBELL, Primary Examiner

R. W. CHURCH, Assistant Examiner

U.S. Cl. X.R.

29—25.42, 527.2, 620, 623, 629; 117—212; 174—68.5; 204—201; 317—101; 339—17